(12) United States Patent
Calabretta et al.

(10) Patent No.: US 11,482,503 B2
(45) Date of Patent: Oct. 25, 2022

(54) METHOD FOR THE MANUFACTURE OF INTEGRATED DEVICES INCLUDING A DIE FIXED TO A LEADFRAME

(71) Applicant: STMICROELECTRONICS S.R.L., Agrate Brianza (IT)

(72) Inventors: Michele Calabretta, Giarre (IT); Crocifisso Marco Antonio Renna, Floridia (IT); Sebastiano Russo, Santa Tecla di Acireale (IT); Marco Alfio Torrisi, Aci Sant'Antonio (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 31 days.

(21) Appl. No.: 16/811,964

(22) Filed: Mar. 6, 2020

(65) Prior Publication Data
US 2020/0294950 A1    Sep. 17, 2020

(30) Foreign Application Priority Data

Mar. 11, 2019    (IT) .......................... 102019000003511

(51) Int. Cl.
*H01L 23/00* (2006.01)
*B23K 35/26* (2006.01)
(Continued)

(52) U.S. Cl.
CPC ............ *H01L 24/29* (2013.01); *B23K 35/262* (2013.01); *C22C 13/00* (2013.01); *H01L 23/3121* (2013.01); *H01L 23/49513* (2013.01); *H01L 23/49541* (2013.01); *H01L 23/49579* (2013.01); *H01L 24/27* (2013.01); *H01L 24/32* (2013.01); *H01L 24/83* (2013.01); *B23K 2101/40* (2018.08); *H01L 24/48* (2013.01); *H01L 24/73* (2013.01); *H01L 2224/2912* (2013.01); *H01L 2224/29105* (2013.01); *H01L 2224/29109* (2013.01); *H01L 2224/29111* (2013.01); *H01L 2224/29139* (2013.01);
(Continued)

(58) Field of Classification Search
CPC ........................ H01L 23/49579–49582; H01L 2224/29101–29111; H01L 2224/83801–8383
See application file for complete search history.

(56) References Cited

U.S. PATENT DOCUMENTS 4,170,472 A * 10/1979 Olsen ................... B23K 35/262
                                                            420/562
7,579,677 B2     8/2009 Ikeda et al.
(Continued)

*Primary Examiner* — Amar Movva
(74) *Attorney, Agent, or Firm* — Seed IP Law Group

(57) ABSTRACT

A method for soldering a die obtained using the semiconductor technique with a leadframe, comprising the steps of providing a leadframe, which has at least one surface made at least partially of copper; providing a die, which has at least one surface coated with a metal layer; applying to the surface a solder alloy comprising at least 40 wt % of tin or at least 50% of indium or at least 50% of gallium, without lead, and heating the alloy to a temperature of at least 380° C. to form a drop of solder alloy; providing a die, which has at least one surface coated with a metal layer; and setting the metal layer in contact with the drop of solder alloy to form the soldered connection with the leadframe. Moreover, a device obtained with said method is provided.

20 Claims, 6 Drawing Sheets

(51) Int. Cl.
*C22C 13/00* (2006.01)
*H01L 23/31* (2006.01)
*H01L 23/495* (2006.01)
*B23K 101/40* (2006.01)

(52) U.S. Cl.
CPC ............... *H01L 2224/29147* (2013.01); *H01L 2224/29155* (2013.01); *H01L 2224/32245* (2013.01); *H01L 2224/48091* (2013.01); *H01L 2224/48245* (2013.01); *H01L 2224/73265* (2013.01); *H01L 2224/83192* (2013.01); *H01L 2224/83801* (2013.01); *H01L 2924/014* (2013.01); *H01L 2924/20109* (2013.01)

(56) References Cited

U.S. PATENT DOCUMENTS

| | | |
|---|---|---|
| 8,710,678 B2 | 4/2014 | Ganitzer et al. |
| 8,872,315 B2 | 10/2014 | Hosseini et al. |
| 2005/0218525 A1 | 10/2005 | Takahashi et al. |
| 2008/0105907 A1 | 5/2008 | Otremba et al. |
| 2014/0008419 A1* | 1/2014 | Takahashi ................ B23K 1/19 228/208 |
| 2015/0072473 A1 | 3/2015 | Lam et al. |
| 2018/0033761 A1* | 2/2018 | Watanabe ............ H01L 23/053 |

* cited by examiner

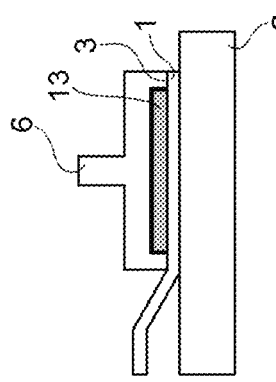
FIG. 1A
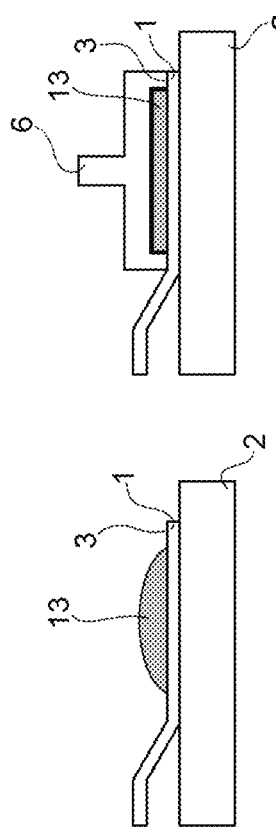
FIG. 1B
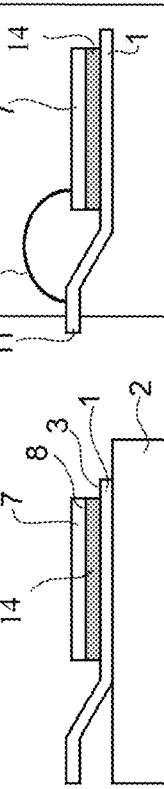
FIG. 1C
FIG. 1D
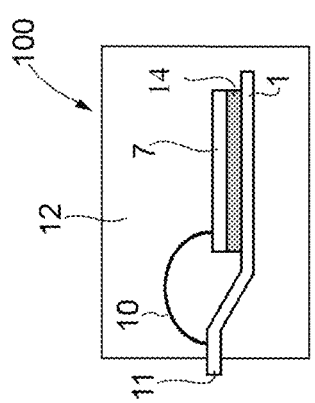
FIG. 1E
FIG. 1F
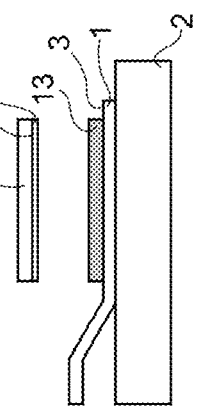
FIG. 1G
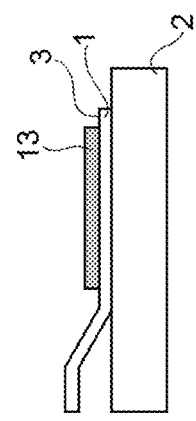
FIG. 1H

METHOD FOR THE MANUFACTURE OF INTEGRATED DEVICES INCLUDING A DIE FIXED TO A LEADFRAME

BACKGROUND

Technical Field

The present disclosure relates to the manufacture of integrated electronic circuits, in particular for soldering a die to a connection support, typically a "leadframe."

Description of the Related Art

During manufacture of integrated electronic devices, the semiconductor die, which integrates electronic components and/or other components made with semiconductor technology, such as power devices, is often soldered to a connection support (also known as "leadframe" or simply "frame"). This soldering process is commonly referred to as "die attach,"

The frame performs the role of mechanical support for the die, enables electrical contact of the die with the outside world, and can serve for dissipating the heat generated within the device.

Consequently, it is beneficial for the soldering material to have low electrical resistance and high thermal conductivity.

It is also beneficial for the soldered connection to withstand repeated stresses and maintain its own integrity. These stresses are due to the temperature variations of the electronic circuits during their service life. Since the die and the frame have different coefficients of thermal expansion, with variations of the operating temperature they tend to expand in a way different from one another thus generating, on account of the constraint that binds them together, stresses within the structure. Consequently, the system constituted by the die, the frame, and the soldering material undergoes a mechanical stress as a function of the temperature.

The different methods for carrying out metallurgical soldering of a die with a metal frame include: soldering carried out using gold-based alloys (referred to as "hard die-attach"), and soft brazing using lead-based or tin-based alloys.

In the former case, strong bonds are created with excellent thermal and electrical properties, but the stiffness may cause fracturing of the die during the thermal cycles in so far as the stiff soldered connection transfers the thermal stress to the die, which, given that it is a brittle material, cannot undergo plastic deformation.

Moreover, gold-based solder alloys used for hard die-attach, such as the 80Au-20Sn alloy, have a very high cost and are consequently not commercially advantageous. Finally, the procedures for carrying out soldering by means of such alloys, which can be used to obtain diffusion-soldering processes (through diffusion of a chemical species present in the frame), is complex and uses dedicated process steps and machinery that are not commonly used in the manufacture of electronic circuits.

Soft brazing using lead-based alloys, instead, is sufficiently plastic for compensating for the differences in thermal expansion between the die and the frame, but is in any case liable to yielding due to fatigue after repeated thermal cycles.

However, the increasingly stringent regulations for limiting use of dangerous substances in the manufacture of electronic devices have led to the development of solder alloys with low-content of lead or even leadless.

For instance, U.S. Pat. No. 4,170,472 illustrates alloys based on tin, silver, and antimony, amongst which, the 65Sn-25Ag-10Sb alloy (known also as "J alloy") is particularly preferred.

U.S. Pat. No. 4,170,472 describes a method for soldering a die coated with chromium/silver or nickel/tin with a frame coated with nickel or silver.

However, the above soldering processes have proven far from resistant to repeated thermal cycles, resulting in a poor reliability of the performance of the system.

BRIEF SUMMARY

In particular, one or more embodiments of the present disclosure provide a new method for soldering a die to a leadframe, and an integrated device incorporating the same.

In particular, the ensuing description relates to a method for soldering a die to a leadframe comprising the steps of:

a) providing a leadframe, which has at least one surface at least partially made of copper;

b) providing a die, which has at least one surface coated with a metal layer;

c) applying, to the surface at least partially made of copper of the leadframe, a solder alloy and heating the alloy to a temperature of at least 380° C. to form a drop of solder alloy, where the solder alloy is leadless and is chosen from the group constituted by alloys comprising at least 40 wt % of tin, alloys comprising at least 50 wt % of indium, and alloys comprising at least 50 wt % of gallium; and d) setting the metal layer of the die in contact with the drop of solder alloy to form the soldered connection with the leadframe.

Advantageously, the soldering method can be carried out on a leadframe entirely made of copper or alternatively having just one surface at least partially coated with copper.

The alloy used may be an alloy chosen from the group constituted by:

61-69% tin, 8-11% antimony, and 23-28% silver;
50-99% tin, 1-5% silver;
98-98.9% tin, 1-5% silver, 0.1-1% copper;
50-99% indium, 1-50% silver;
50-99% gallium, 1-50% nickel;
50-99% gallium, 1-50% copper; and
70-99% gallium, 1-30% silver;
the percentages being expressed in weight over the total weight of the alloy. More in particular the alloy contains 65% tin, 25% silver, 10% antimony (65Sn-25Ag-10Sb), the percentages being expressed in weight over the total weight of the alloy.

In one embodiment, the die is provided with at least one surface coated with a metal layer in particular obtained with a metal selected in the group constituted by titanium, nickel, gold, silver, aluminum, and copper.

Advantageously, use of a frame made of copper or coated even only partially with copper and a solder alloy comprising at least 40% tin, at least 50% indium, or at least 50% gallium at a temperature of at least 380° C. makes it possible to carry out soldering by diffusion in liquid phase that leads to formation of a high-melting intermetal compound between copper and tin (for example, $Cu_3Sn$ and/or $Cu_6Sn_5$), gallium or indium. In particular, the melting point of the intermetal compound that is formed is higher than the melting point of the solder alloy used. Formation of the intermetal compound does not involve just the interface between the frame and the solder alloy or the interface between the die and the solder alloy, as in the case of the soldering method illustrated in U.S. Pat. No. 4,170,472, but involves the entire mass of solder alloy applied on the frame.

Advantageously, it has been noted that formation of the intermetal compound by diffusion of the copper within the mass of solder alloy enables considerable improvement of the mechanical strength of the system constituted by the die and the frame when it is subjected to thermal cycling as compared to systems obtained with soldering methods of the prior art. This is due to the fact that the intermetal compound obtained, given that it is a high-melting compound, is less sensitive to the mechanism of degradation due to creep with respect to the solder alloy.

Advantageously, the soldering method described above enables shorter times with respect to methods known in the prior art to obtain diffusion of the copper in the solder alloy; in particular, steps c) and d) as a whole have a duration of 0.1-10 s.

BRIEF DESCRIPTION OF THE SEVERAL VIEWS OF THE DRAWINGS

Further characteristics and advantages of the present method will emerge from the ensuing description of some illustrative and non-limiting examples of embodiment thereof, which refer, where required, to the annexed drawings, wherein:

FIGS. 1A-1H are a schematic representation of the present method;

DETAILED DESCRIPTION

Figure 2B:
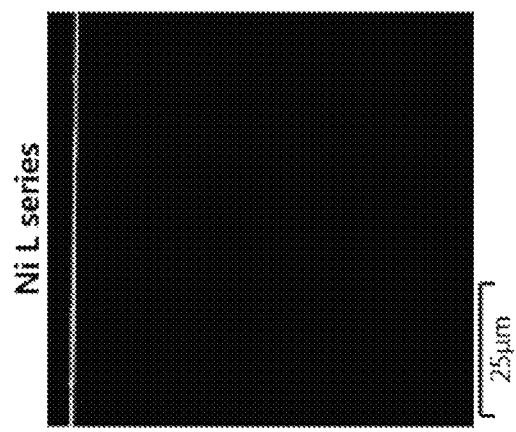
FIGS. 2A and 2B illustrate, respectively, the EDX (Energy Dispersive X-ray) spectrum of a soldered connection obtained by means of the present method and the EDX spectrum of a soldered connection obtained with an SnAgSb alloy on a nickel frame.

The present method will now be described with reference to FIGS. 1A-1H, which show the steps of an embodiment of the method.

FIG. 1A represents a connection support constituted by a leadframe 1 entirely made of copper. The leadframe 1 is arranged on a support 2. The leadframe 1 is provided with a surface 3. In the case where the leadframe 1 is not entirely made of copper, the surface 3 is formed by a layer of copper.

In the embodiment illustrated, the leadframe 1 is heated to a temperature of at least 380° C.

As illustrated in FIG. 1B, on the surface 3 of the leadframe 1 a solder alloy 4 is applied, for example consisting of 65% tin, 25% silver, and 10% antimony (65Sn-25Ag-10Sb) in a way similar to what is usually carried out with the soft-brazing technique. For this purpose, a wire of solder alloy 4 is applied, through a guide 5, on the surface 3 of the heated leadframe 1 to cause the melting of the wire of solder alloy 4 and deposition of a solder layer 13 in the form of a drop comprising a pre-set amount of solder alloy 4 on the surface 3 (FIG. 1C) of the frame 1.

The solder layer 13 thus dispensed can then optionally be spread evenly over the surface 3 by means of a mold 6 (FIGS. 1D and 1E).

Alternatively, the solder alloy can be applied on the surface 3 of the leadframe 1 in the form of a solder pre-form, which generates, following upon melting in contact with the heated leadframe 1, a clearly defined volume of solder layer 13 on the surface 3.

Next, as illustrated in FIG. 1F, a die 7 provided with a surface 8 coated with a metal layer 9, for example nickel, and protected by a sacrificial layer of silver or gold, is applied on the solder layer 13 in such a way that the metal layer 9 comes into contact with said solder layer 13. The die 7 is typically made of semiconductor material, integrates electronic components and/or micro-integrated structures (not illustrated) obtained with semiconductor technology.

The contact of the solder layer 13 with the metal layer 9, while the solder layer 13 is heated to a temperature of at least 380° C. (which is beyond its melting point), forms a soldered connection 14 as shown in FIG. 1G. Then, the ensemble constituted by the die 7, soldered connection 14, and the leadframe 2 thus obtained is left to cool until soldering is completed (FIG. 1G). Heating the solder layer 13 to a temperature of at least 380° C. causes copper from the surface 3 of the leadframe 1 to diffuse into the solder layer 13 such that the resulting soldered connection 14 includes an intermetallic formation of the diffused copper in the solder material.

Finally, FIG. 1H, electrical interconnection elements such as electrical bonding wires 10 are soldered between the die 7 and the pins 11 of the leadframe 2, as illustrated schematically in FIG. 1H (wire-bonding) step, and packaging is carried out, for example via molding of a package 12 made of insulating material, for example resin (molding compound). After execution of the final manufacture steps, such as curing of the package 12, possible separation of the pins 11, etc., in a way known to the person skilled in the art, an integrated device 100 is obtained, for example a power device.

Advantageously, the method illustrated in FIGS. 1A-1H is carried out with machinery commonly known and used in the standard die-attach processes, and uses commercially available materials, and can be used both on lines for production of discrete devices and on lines for production of power modules.

The above method may also be used in the case of clip mounting, in which a metal structure (clip) is brazed on the top surface of the die 7. Moreover, the method described can be used for soldering two connection and/or supporting structures on two opposite surfaces of the die.

Alternatively, in the case where the solder layer 13 is a pre-form and where the leadframe 1 is not previously heated, it is possible to obtain melting of the pre-form by means of heating in an oven after the pre-form in the solid state has been arranged between the connector and the die.

Advantageously the method makes it possible to obtain a soldered connection 14 with a thickness of up to 100 μm with improved thermo-electro-mechanical properties with respect to those obtained with the known methods as highlighted in the ensuing examples.

Example 1

EDX (Energy Dispersive X-ray) spectroscopy analysis of a soldered connection obtained by means of the method according to the disclosure.

Figure 2A:
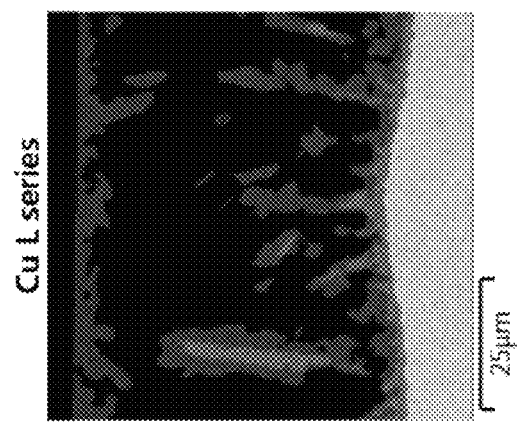
Figure 3A:
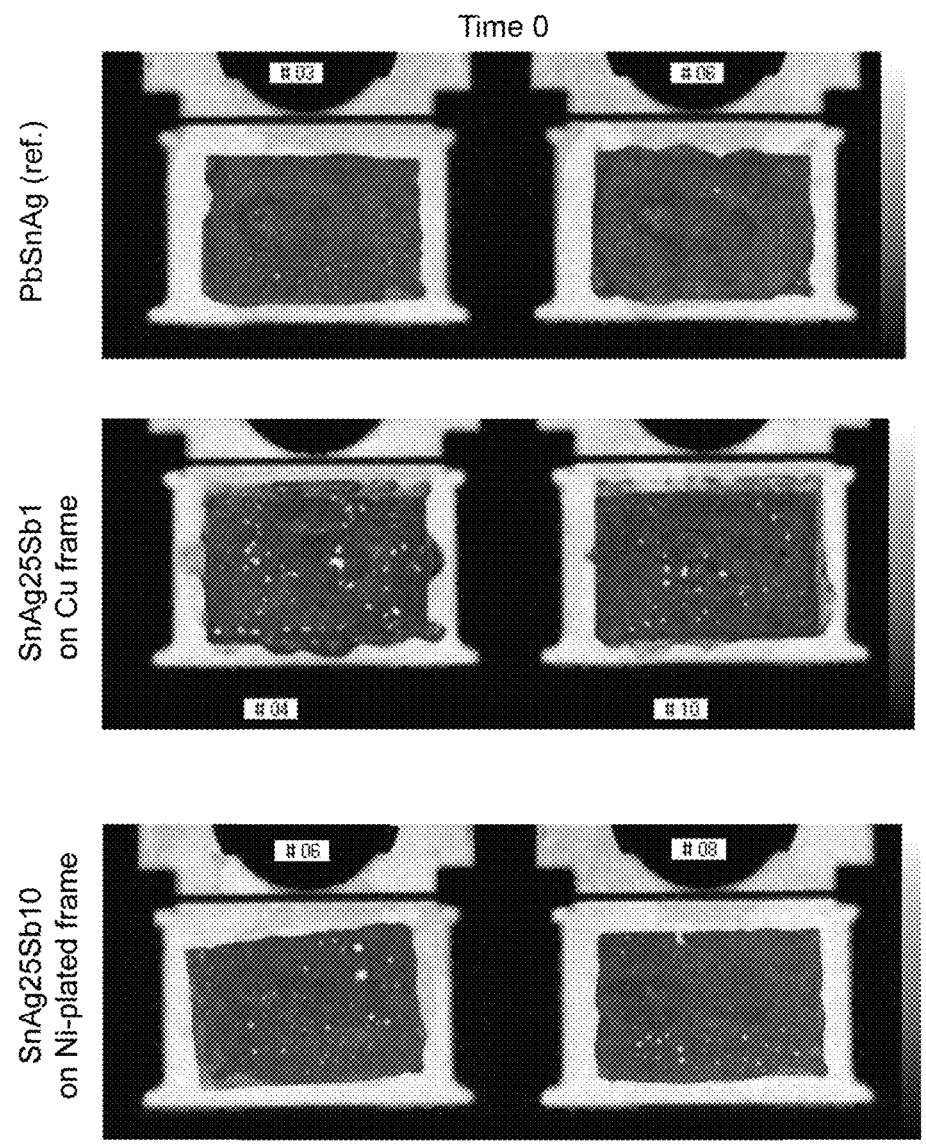
FIGS. 3A-3D illustrate the SAM (Scanning Acoustic Microscope) images of a soldered connection obtained by applying the present method as compared to a soldered connection obtained with an SnAgSb alloy on a nickel frame (hence without diffusion of copper) and a lead-based soldered connection according to the prior art after repeated thermal cycles.
Figure 3B:
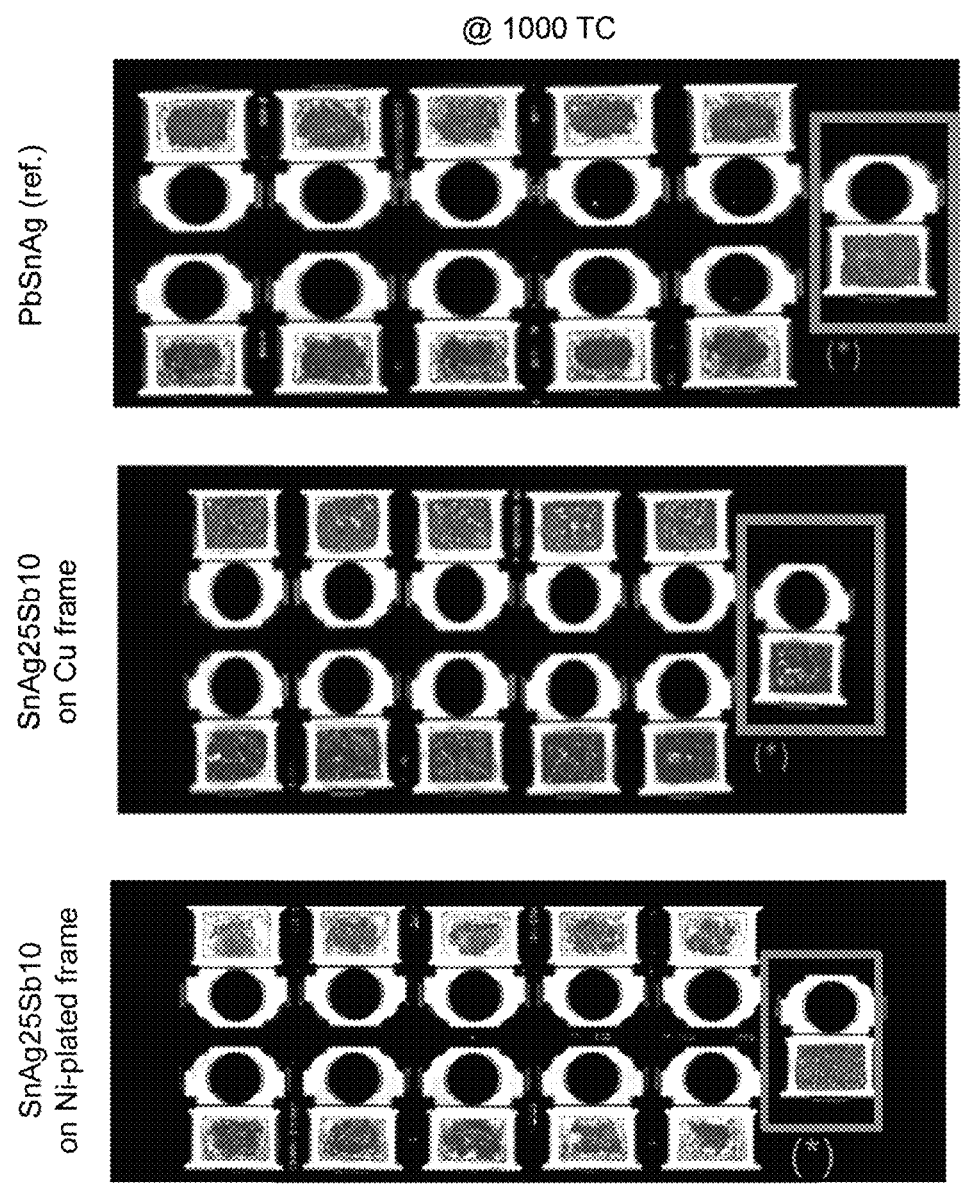
Figure 3C:
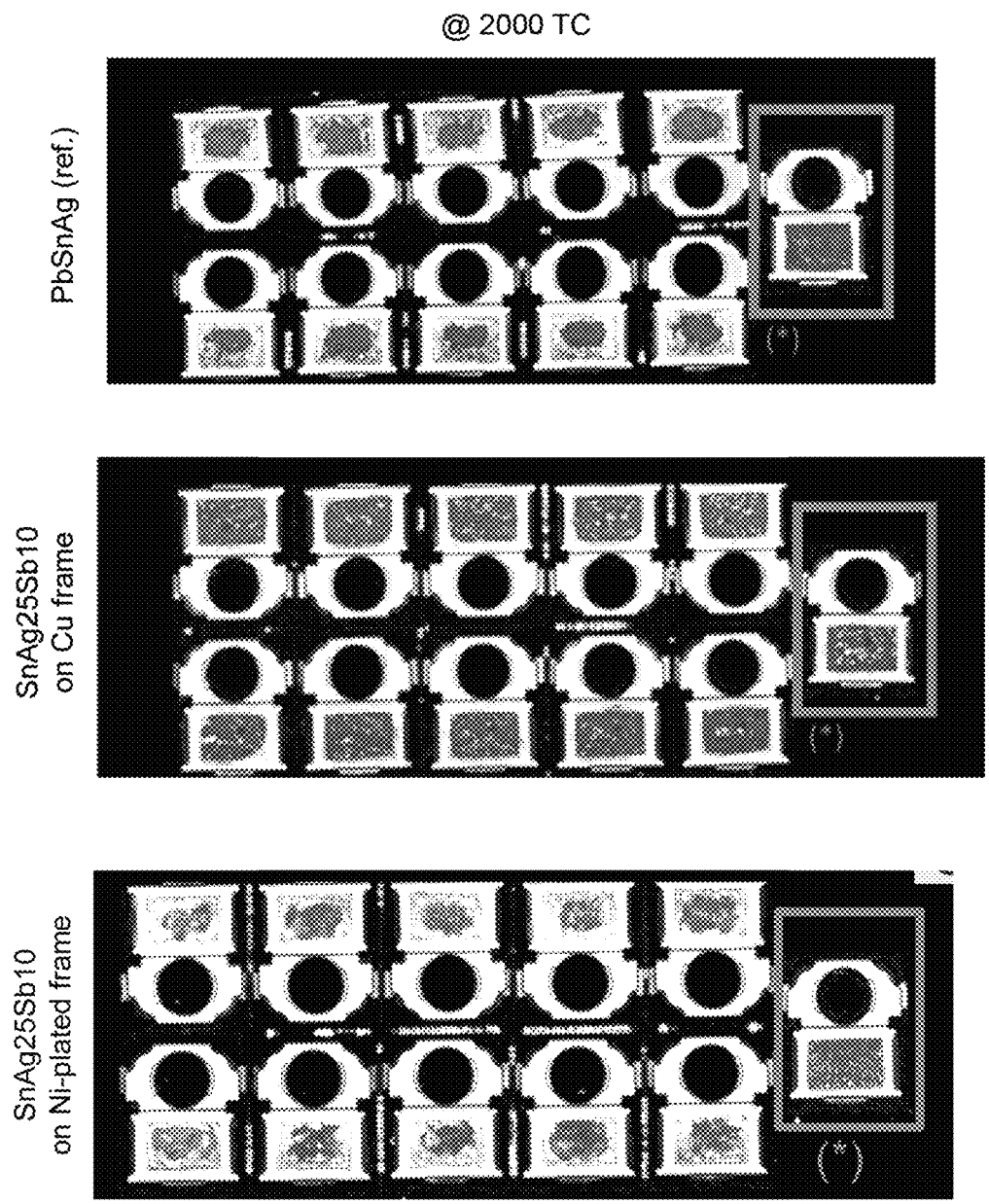
Figure 3D:
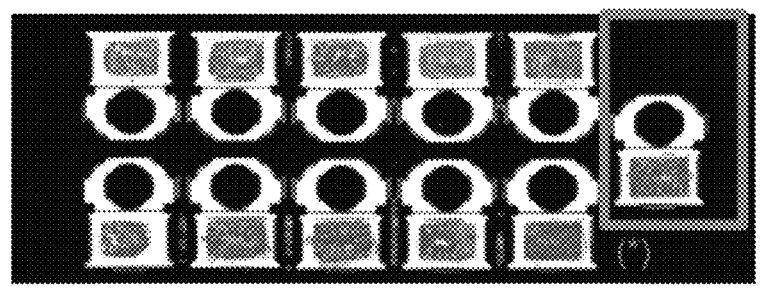
Figure 3D:
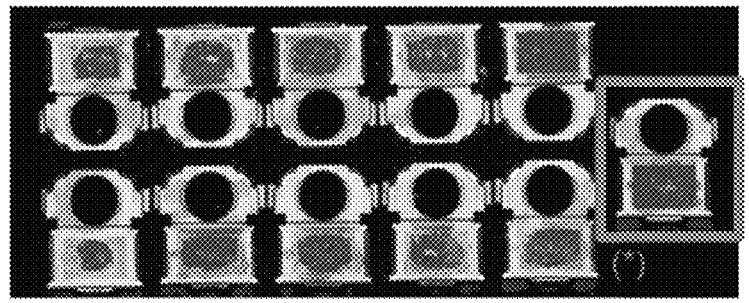

A soldered connection obtained by means of the method according to the disclosure with the use of 65Sn-25Ag-10Sb solder alloy and a frame made of copper has been analyzed by means of EDX spectroscopy and compared with the EDX spectra of soldered connections obtained with the 65Sn-25Ag-10Sb solder alloy on frames coated with nickel. The spectra are shown in FIGS. 2A and 2B, respectively.

As may be noted, in the case where frames of naked copper are used, there is a diffusion of the copper throughout the thickness of the solder alloy, which creates an intermetal compound with the material constituting the solder alloy. In the case of assembly with frames made of copper with a nickel finish this does not occur.

Example 2

Reliability of the soldered connection obtained by means of the present method.

A soldered connection obtained with the present method using the 65 Sn-25Ag-10Sb solder alloy and a frame made of copper was evaluated in different tests and compared with a soldered connection carried using a 65Sn-25Ag-10Sb alloy and a frame with nickel finish. A further comparison was made with a lead-based alloy (95.5Pb-2Sn-2.5Ag) according to the prior art.

The tests conducted on 25 samples are described in the following:

A.T.E. (Automatic Testing Equipment) manufactured by—TESEC—evaluation of the static electrical parameters of the device (on-state resistance, breakdown voltage, leakage currents, forward voltages, etc.) and of the corresponding deviations; this test was considered failed in the presence of variations of more or less 20% with respect to the value measured at time zero.

T.IMP. (deviation of Thermal Impedance)—this test was considered failed when the sample presented an increase in the impedance of more than 20% with respect to the initial value.

S.A.M. (Scanning Acoustic Microscopy) for assessing physical delamination—this test was considered failed when the sample presented a physical delamination of more than 20% as compared to the initial sample.

The results regarding the number of failures for each soldered connection in each test appear in Table 1.

TABLE 1

| Alloy | Finish frame | Test | Thermal cycles (−65° C./+150° C.) | | | | | | | | |
|---|---|---|---|---|---|---|---|---|---|---|---|
| | | | 200 | 500 | 1000 | 1500 | 2000 | 2500 | 3000 | 5000 | 7000 |
| 95.5Pb—2Sn—2.5Ag | Ni | A.T.E. | 0/25 | 0/25 | 0/25 | 1/25 | 4/25 | / | / | / | / |
| | | T.IMP. | 0/25 | 0/25 | 0/25 | 9/25 | 25/25 | / | / | / | / |
| | | S.A.M. | 0/25 | 0/25 | 2/25 | 9/25 | 25/25 | / | / | / | / |
| 65Sn—25Ag—10Sb | Ni | A.T.E. | 0/25 | 0/25 | 0/25 | 2/25 | 8/25 | / | / | / | / |
| | | T.IMP. | 0/25 | 0/25 | 6/25 | 14/25 | 25/25 | / | / | / | / |
| | | S.A.M. | 0/25 | 1/25 | 6/25 | 14/25 | 25/25 | / | / | / | / |
| 65Sn—25Ag—10Sb | Cu | A.T.E. | 0/25 | 0/25 | 0/25 | 0/25 | 0/25 | 0/25 | 0/25 | 0/25 | 2/25 |
| | | T.IMP. | 0/25 | 0/25 | 0/25 | 0/25 | 0/25 | 0/25 | 1/25 | 2/25 | 5/25 |
| | | S.A.M. | 0/25 | 0/25 | 0/25 | 0/25 | 0/25 | 0/25 | 0/25 | 0/25 | 0/25 |

The solution proposed shows a benefit in terms of reliability performance with a factor higher than 5 with respect to the prior art.

Moreover, FIGS. 3A-3D present the images of the SAM of the soldered connection obtained with 65Sn-25Ag-10Sb solder alloy on a copper frame, with 65Sn-25Ag-10Sb solder alloy on a nickel frame and with 95.5Pb-2Sn-2.5Ag solder alloy on a nickel frame.

From the experimental comparison in thermal cycling it emerges how the solution with 65Sn-25Ag-10Sb solder alloy manages to exceed 3000 thermal cycles without presenting any deviation, whereas, given the same conditions but with the use of a nickel-plated frame or with assembly with PbSnAg solder paste it is not possible to go beyond 1000 cycles. From FIGS. 3B, 3C, 3D there emerges the level of degradation and delamination of the soldered connection during cycling as a function of the number of thermal cycles.

Finally, it is clear that modifications and variations may be made to the method and to the device described and illustrated herein, without thereby departing from the scope of the present disclosure, as defined in the annexed claims. For instance, the various embodiments described may be combined so as to provide further solutions. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Moreover, even though the device illustrated is assembled via soldering electrical elements with bonding wires 10 between the die and the pins of the leadframe and via encapsulation by means of molding of a package made of insulating material, other solutions may be envisaged, such as clip attach or encapsulation with metal packages or potted assemblies with the use of silicone gel.

The invention claimed is:

1. A device, comprising:
   a leadframe having a copper surface;
   a semiconductor die having a surface;
   a metal coating layer on the surface of the semiconductor die; and
   a soldered connection between the copper surface of the leadframe and the surface of the semiconductor die, the solder connection couples the leadframe to the semiconductor die, the soldered connection including:
      a leadless solder alloy selected from the group consisting of alloys including at least 98 wt % of tin, alloys including at least 50 wt % of indium and alloys including at least 50 wt % of gallium, and the leadless solder alloy has a melting point less than 380° C.; and
   a plurality of copper portions including:
      first ones of the plurality of copper portions are integral the copper surface of the leadframe that extend from the copper surface of the leadframe into the leadless solder alloy; and
      second ones of the plurality copper portions are spaced apart from the copper surface and are diffused within the soldered connection.

2. The device according to claim 1, further comprising a package of insulating material at least partially surrounding the semiconductor die and the leadframe.

3. The device according to claim 1, wherein the leadframe is entirely made of copper.

4. The device according to claim 1, wherein the leadless solder alloy is selected from the group consisting of:
an alloy that includes 98-98.9 wt % tin, 1-5 wt % silver, and 0.1-1 wt % copper;
an alloy that includes 50-99 wt % indium, 1-50 wt % silver;
an alloy that includes 50-99 wt % gallium, 1-50 wt % nickel;
an alloy that includes 50-99 wt % gallium, 1-50 wt % copper; and
an alloy that includes 70-99 wt % gallium, 1-30 wt % silver,
wherein the percentages for each alloy being expressed in weight over the total weight of the alloy.

5. The device according to claim 1, wherein the soldered connection is obtained by heating the leadless solder alloy for a time interval ranging between 0.1 seconds and 10 seconds.

6. The device of claim 1, wherein:
the first ones of the plurality of copper portions terminate within the leadless solder before reaching the metal coating layer; and
the second ones of the plurality of copper portions terminate within the leadless solder before reaching the metal coating layer.

7. A device, comprising:
a leadframe having a copper surface;
a semiconductor die having a surface;
a metal coating layer on the surface of the semiconductor die; and
a soldered connection between the copper surface of the leadframe and the surface of the semiconductor die, the solder connection couples the semiconductor die to the leadframe, the solder connection including:
a leadless solder alloy having 0% lead, and the leadless solder alloy being selected from the group consisting of alloys including more than 70 wt % of tin, alloys including at least 50% of indium, and alloys including at least 50% of gallium;
a plurality of copper portions including:
first ones of the plurality of copper portions integral the copper surface of the leadframe that extend from the copper surface of the leadframe into the leadless solder alloy; and
second ones of the plurality of copper portions are diffused within the leadless solder alloy;
a plurality of metal portions integral the metal coating layer on the surface of the semiconductor die extends into the leadless solder alloy.

8. The device according to claim 7, comprising a package of insulating material at least partially surrounding the die and the leadframe.

9. The device according to claim 7, wherein the leadframe is entirely made of copper.

10. The device according to claim 7, wherein the solder alloy is selected from the group consisting of:
an alloy that includes 71-99% tin, 1-5% silver;
an alloy that includes 98-98.9 wt % tin, 1-5% silver, 0.1-1% copper;
an alloy that includes 50-99 wt % indium, 1-50% silver;
an alloy that includes 50-99 wt % gallium, 1-50% nickel;
an alloy that includes 50-99 wt % gallium, 1-50% copper; and
an alloy that includes 70-99 wt % gallium, 1-30% silver, the percentages for each alloy being expressed in weight over the total weight of the alloy.

11. The device according to claim 7, wherein the soldered connection is obtained by heating the leadless solder alloy for a time interval ranging between 0.1 seconds and 10 seconds.

12. The device of claim 7, wherein:
the first ones of the plurality of copper portions terminate within the leadless solder alloy before reaching the metal coating layer;
the second ones of the plurality of copper portions terminate within the leadless solder alloy before reaching the metal coating layer; and
the plurality of metal portions terminate within the leadless solder alloy before reaching the plurality of copper portions.

13. A device, comprising:
a leadframe having a first metal layer at a surface of the leadframe;
a semiconductor die having a surface;
a second metal layer on the surface of the semiconductor die; and
a solder connection coupling the surface of the leadframe to the surface of the semiconductor die, the solder connection including:
a solder alloy selected from a group consisting of alloys including no lead and 40 wt % tin, alloys including no lead and at least 50 wt % of indium, and alloys including no lead and at least 50 wt % of gallium,
a plurality of first metal portions integral the first metal layer extends into the solder alloy that includes no lead;
a plurality of second metal portions integral the second metal layer extends into the solder alloy that includes no lead; and
a plurality of third metal portions previously part of the first metal layer and the second metal layer diffused within the solder alloy.

14. The device according to claim 13, further comprising a package of insulating material at least partially surrounding the die and the leadframe.

15. The device according to claim 13, wherein the leadframe is entirely made of copper.

16. The device according to claim 13, wherein the solder alloy with 0% lead is selected from the group consisting of:
an alloy that includes 50-99 wt % indium, 1-50 wt % silver;
an alloy that includes 50-99 wt % gallium, 1-50 wt % nickel;
an alloy that includes 50-99 wt % gallium, 1-50 wt % copper; and
an alloy that includes 70-99 wt % gallium, 1-30 wt % silver, wherein the percentages for each alloy being expressed in weight over the total weight of the alloy.

17. The device according to claim 13, wherein the soldered connection is obtained by heating the solder alloy for a time interval ranging between 0.1 seconds and 10 seconds.

18. The device according to claim 13, wherein the soldered connection is obtained by heating the solder alloy to a temperature of at least 380° C.

19. The device according to claim 13, wherein the surface is a copper surface and copper from the copper surface of the leadframe is diffused within the solder alloy.

20. The device of claim 13, wherein:
ones of the plurality of third metal portions are fully suspended within leadless solder alloy;
the plurality of first metal portions terminate within the leadless solder alloy before reaching the plurality of second metal portions; and
the plurality of second metal portions terminate within the leadless solder alloy before reaching the plurality of first metal portions.

* * * * *